United States Patent
Li et al.

(10) Patent No.: US 7,315,272 B2
(45) Date of Patent: Jan. 1, 2008

(54) INVERTER-BASED FLASH ANALOG-TO-DIGITAL CONVERTER USING FLOATING RESISTOR LADDER

(75) Inventors: Day-Uei Li, Taipei (TW); Chun-Chi Chen, Taipei (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 11/260,065

(22) Filed: Oct. 27, 2005

(65) Prior Publication Data

US 2007/0096970 A1 May 3, 2007

(51) Int. Cl.
*H03M 1/36* (2006.01)

(52) U.S. Cl. ..................... 341/159; 341/158

(58) Field of Classification Search ........ 341/100–170, 341/158–159
See application file for complete search history.

(56) References Cited

U.S. PATENT DOCUMENTS

| | | | | | |
|---|---|---|---|---|---|
| 3,599,096 | A | * | 8/1971 | Stemples et al. | ....... 324/140 R |
| 4,524,315 | A | * | 6/1985 | Nakatani et al. | ............ 318/603 |
| 4,524,317 | A | * | 6/1985 | Millard | ....................... 323/224 |
| 4,554,671 | A | * | 11/1985 | Collins | ......................... 341/143 |
| 4,620,157 | A | * | 10/1986 | Hayashi | ...................... 324/141 |
| 6,333,709 | B2 | * | 12/2001 | Miyamoto | .................. 341/158 |
| 6,448,917 | B1 | * | 9/2002 | Leung et al. | ................ 341/144 |
| 6,661,365 | B1 | * | 12/2003 | Bugeja | ......................... 341/160 |
| 6,911,849 | B2 | * | 6/2005 | Kondou | ...................... 327/124 |
| 7,154,423 | B2 | * | 12/2006 | Kondo | ......................... 341/136 |
| 2001/0000661 | A1 | * | 5/2001 | Miyamoto | ................... 341/56 |

* cited by examiner

*Primary Examiner*—Lam T. Mai
(74) *Attorney, Agent, or Firm*—Akin Gump Strauss Hauer & Feld LLP

(57) ABSTRACT

An analog-to-digital converter device for converting an analog signal into a digital signal includes a comparator array including a plurality of comparators, each of the comparators including a first inverter and a second inverter connected in series with the first inverter, a resistor string including a plurality of resistors connected in series, each of the resistors corresponding to one of the plurality of comparators, and a current generator for providing a constant current flowing through the resistor string.

32 Claims, 10 Drawing Sheets

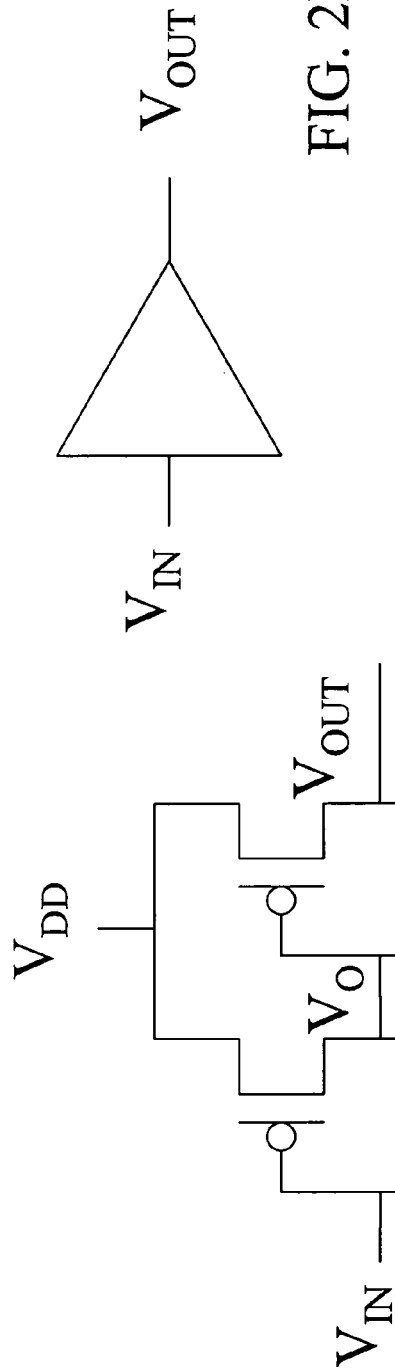
FIG. 2A
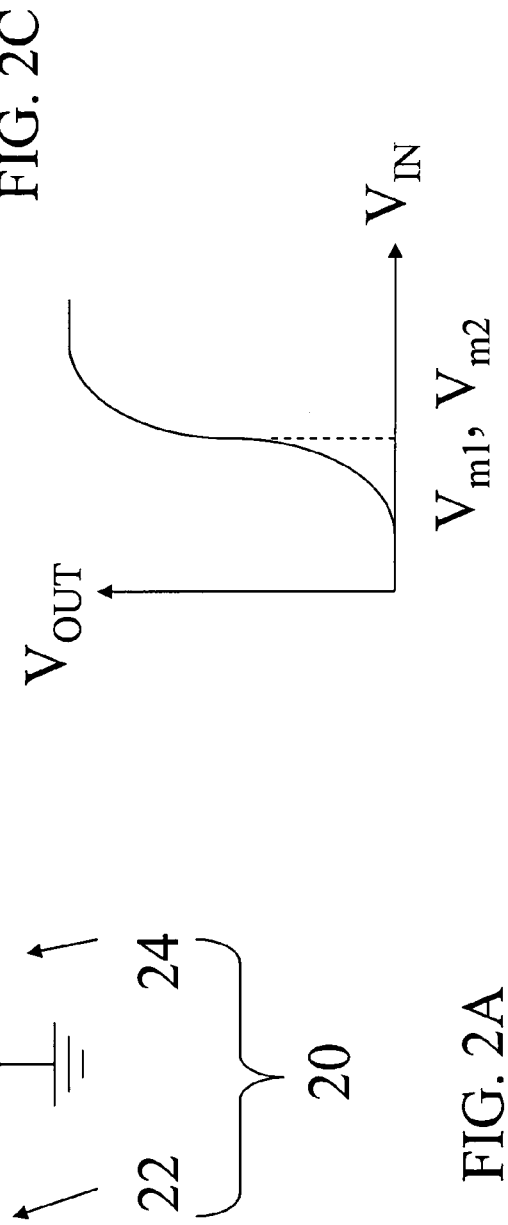
FIG. 2B
FIG. 2C

INVERTER-BASED FLASH ANALOG-TO-DIGITAL CONVERTER USING FLOATING RESISTOR LADDER

BACKGROUND OF THE INVENTION

The present invention generally relates to an analog-to-digital converter ("ADC") and, more particularly, to an inverter-based flash ADC including a floating resistor ladder for use, for example, in ultra wideband ("UWB") transceivers.

An analog-to-digital converter ("ADC") is a device for converting an input analog signal, either in the form of a voltage or current, into a digital signal. ADCs are typically divided into successive approximation ADCs and flash ADCs. A successive approximation ADC functions to sequentially determine bits of a digital code corresponding to an analog input. Generally, a successive approximation ADC requires one clock cycle per bit of resolution. On the other hand, a flash ADC, which includes a more complicated hardware structure than the successive approximation ADC, is able to complete the entire analog-to-digital conversion process simultaneously rather than sequentially, generally in only one clock cycle.

Of the flash ADCs, an inverter-based flash ADC, which employs the TIQ (threshold-inverter-quantization) technique, meets the requirements of low power consumption and low supply voltage in SOC (system-on-chip) designs. The TIQ technique is advantageous in that it can be integrated with other digital circuits while reducing total power consumption. Such an advantage renders the TIQ technique suitable for use in UWB (ultra wideband) transceivers, in which low power consumption is a matter of concern. However, conventional flash ADCs generally suffer from inverter mismatch, which may occur due to unsymmetry in the fabrication of the inverters of the ADC, disadvantageously resulting in variations in the switching threshold voltages of the inverters. The switching threshold voltage $V_m$ of an inverter is given below.

$$V_m = [r(V_{DD} - |V_{Tp}|) + V_{Tn}]/(1+r)$$

where $V_{DD}$ is the supply voltage of the inverter-based flash ADC, $V_{Tp}$ and $V_{Tn}$ are the threshold voltages of the PMOS and NMOS transistors of the inverter, respectively, and r is further defined below.

$$r = [\mu_P \times C_{OX} \times (W/L)_P]^{1/2} / [\mu_N \times C_{OX} \times (W/L)_N]^{1/2}$$

where $\mu_P$ and $\mu_N$ are the mobility of hole and electron, respectively, $C_{OX}$ refers to a capacitance of an oxide film, and $(W/L)_P$ and $(W/L)_N$ are the channel width to channel length ratios of the PMOS and NMOS transistors of the inverter, respectively.

To overcome the inverter mismatch issue, conventional techniques have been proposed to adjust the factors of $V_m$, including $V_{DD}$, $V_{Tp}$, $V_{Tn}$ and the W/L ratio. In a first approach of the conventional techniques, a supply voltage $V_{DD}$ to be connected to each of the comparators of a flash ADC varies as the $V_m$ varies such that the supply voltage level at one comparator may be different from that at another comparator. In a second approach, the doping density in the transistors of each of the comparators varies such that doping density may be different from comparator to comparator. In a third approach, the W/L ratio in the transistors varies such that the size may be different from comparator to comparator. The first and second approaches, which may have proposed a linear solution, have difficulty in implementation. The third approach may be disadvantageous in layout design and has difficulty in providing transistors with individual threshold voltages.

It is desirable to have a flash ADC that addresses inverter mismatch without changing the size or parameters of the inverters, while retaining the features of an inverter-based flash ADC such as low power consumption as required by a UWB transceiver.

BRIEF SUMMARY OF THE INVENTION

The present invention is directed to an analog-to-digital converter ("ADC") that obviates one or more problems resulting from the limitations and disadvantages of the prior art.

In accordance with an embodiment of the present invention, there is provided an analog-to-digital converter device for converting an analog signal into a digital signal that comprises a comparator array including a plurality of comparators, each of the comparators including a first inverter and a second inverter connected in series with the first inverter, a resistor string including a plurality of resistors connected in series, each of the resistors corresponding to one of the plurality of comparators, and a current generator for providing a constant current flowing through the resistor string.

Also in accordance with the present invention, there is provided an analog-to-digital converter device for converting an analog signal into a digital signal that comprises a comparator array including a plurality of comparators, each of the comparators including a first inverter and a second inverter connected in series with the first inverter, a resistor string including a plurality of resistors, each of the resistors corresponding to one of the plurality of comparators, a receiving comparator selected from one of the plurality of comparators for receiving the analog signal at a node of the resistor string without passing through any resistors of the resistor string, a first sub-string of the resistor string being separated from a second sub-string of the resistor string at the node, a first current generator for providing a first constant current flowing through the first resistor sub-string, and a second current generator for providing a second constant current flowing through the second resistor sub-string having a same value as the first constant current.

Still in accordance with the present invention, there is provided a signal processing system including an analog-to-digital converter for converting an analog signal into a digital signal that comprises an input analog signal, a plurality of resistors connected in series for receiving the analog signal, each of the plurality of resistors including a tap end, a plurality of comparators, each of the comparators including a first inverter connected to one of the plurality of resistors at the tap end of the one resistor, and a second inverter connected in series with the first inverter, and a current generator for providing a constant current flowing through the plurality of resistors.

Further in accordance with the present invention, there is provided a method for converting an analog signal into a digital signal that comprises providing a comparator array including a plurality of comparators, each of the comparators including a first inverter and a second inverter connected in series with the first inverter, serially connecting a plurality of resistors in a resistor string, the resistor string including a plurality of nodes, electrically connecting the plurality of comparators to the resistor string at the plurality of nodes such that each of the plurality of resistors corresponds to one of the plurality of comparators, and flowing a constant current through the resistor string.

Still in accordance with the present invention, there is provided a method for converting an analog signal into a digital signal that comprises providing a comparator array including a plurality of comparators, each of the comparators including a first inverter and a second inverter connected in series with the first inverter, serially connecting a plurality of resistors in a resistor string, the resistor string including a plurality of nodes, electrically connecting the plurality of comparators to the resistor string at the plurality of nodes such that each of the plurality of resistors corresponds to one of the plurality of comparators, selecting a receiving comparator from one of the plurality of comparators for receiving the analog signal at a node of the resistor string without passing through any resistors of the resistor string, separating a first sub-string of the resistor string from a second sub-string of the resistor string at the node, flowing a first constant current through the first sub-string, and flowing a second constant current through the second sub-string having a same value as the first constant current.

BRIEF DESCRIPTION OF THE SEVERAL VIEWS OF THE DRAWINGS

The following detailed description of the preferred embodiments of the present invention will be better understood when read in conjunction with the appended drawings. For the purposes of illustrating the invention, there are shown in the drawings embodiments which are presently preferred. It is understood, however, that the invention is not limited to the precise arrangements and instrumentalities shown. In the drawings:

FIG. 2A is a diagram of a comparator used in an ADC in accordance with one embodiment of the present invention;

FIG. 2B is a circuit symbol of the comparator shown in FIG. 2A;

FIG. 2C is a diagram illustrating the transfer function of the comparator shown in FIG. 2A;

DETAILED DESCRIPTION OF THE INVENTION

Figure 1B:
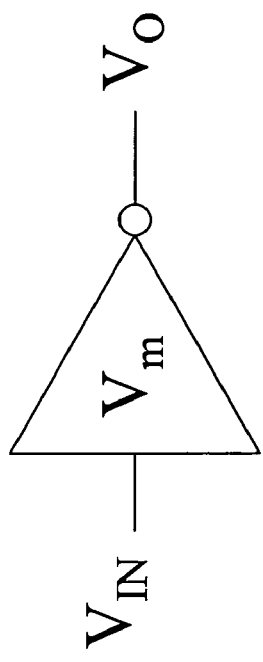
FIG. 1B is a circuit symbol of the inverter shown in FIG. 1A.
Figure 1C:
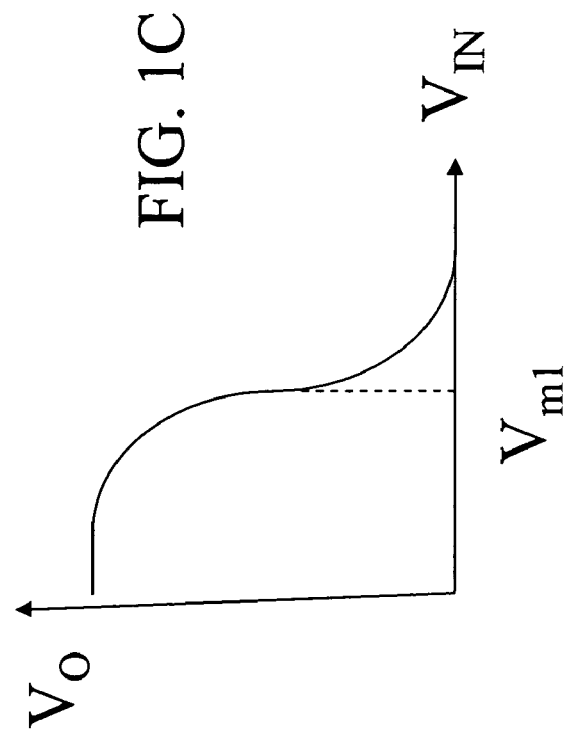
FIG. 1C is a diagram illustrating the transfer function of the inverter shown in FIG. 1A.
Figure 1A:
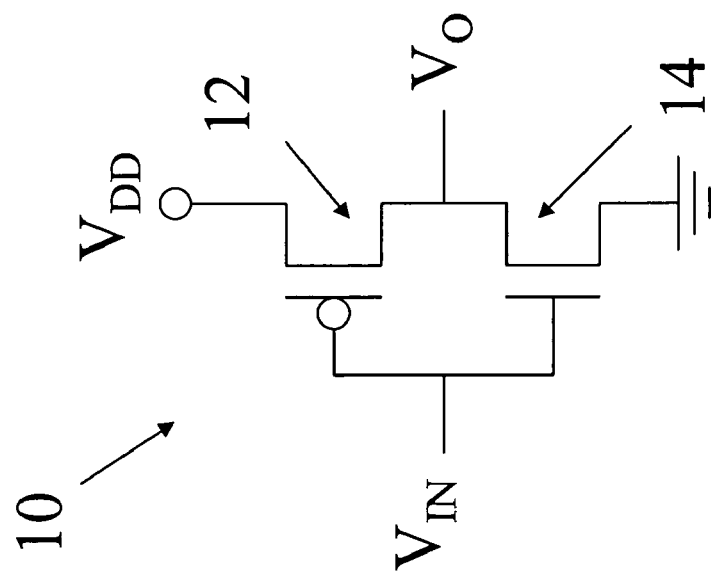
FIG. 1A is a diagram of an inverter used in an analog-to-digital converter ("ADC") in accordance with one embodiment of the present invention.

FIG. 1A is a diagram of an inverter 10 used in an analog-to-digital converter ("ADC") in accordance with one embodiment of the present invention. Referring to FIG. 1A, inverter 10 includes a p-type metal-oxide-semiconductor ("PMOS") transistor 12 and an n-type metal-oxide-semiconductor ("NMOS") transistor 14. When an input signal $V_{IN}$ is greater than a switching threshold voltage $V_m$ of inverter 10, PMOS transistor 12 is turned off and NMOS transistor 14 is turned on. The voltage level of an output voltage $V_O$ is pulled to low ($V_O$=0). When the input signal $V_{IN}$ is smaller than the switching threshold voltage $V_m$, PMOS transistor 12 is turned on and NMOS transistor 14 is turned off. The voltage level of the output voltage $V_O$ is pushed to high ($V_O=V_{DD}$). FIG. 1B is a circuit symbol of inverter 10, and FIG. 1C is a diagram illustrating the transfer function of inverter 10 shown in FIG. 1A.

FIG. 2A is a diagram of a comparator 20 used in an ADC in accordance with one embodiment of the present invention. Referring to FIG. 2A, comparator 20 includes a first inverter 22 and a second inverter 24 connected in series with first inverter 22. First inverter 22 has a first switching threshold voltage $V_{m1}$, and second inverter 24 has a second switching threshold voltage $V_{m2}$. In one embodiment according to the present invention, first inverter 22 and second inverter 24 are fabricated in a complementary metal-oxide-semiconductor ("CMOS") process and have substantially the same size and parameters such as the W/L ratio and the threshold voltages $V_{Tp}$ and $V_{Tn}$. As a result, $V_{m1}$ is substantially equal to $V_{m2}$. In another embodiment, in a comparator array including a plurality of comparators, each of the first and second inverters of the plurality of comparators has substantially the same switching threshold voltage.

In operation, in response to a low-voltage $V_{IN}$, smaller than the switching threshold voltage $V_{m1}$, the output signal $V_O$ of first inverter 22 is $V_{DD}$, which is greater than the switching threshold voltage $V_{m2}$, resulting in an output $V_{OUT}$ of comparator 20 at a ground level. On the contrary, in response to a high-voltage $V_{IN}$, greater than the switching threshold voltage $V_{m1}$, the output signal $V_O$ of first inverter 22 is ground, which is smaller than the switching threshold voltage $V_{m2}$, resulting in an output $V_{OUT}$ of comparator 20 at a $V_{DD}$ level. FIG. 2B is a circuit symbol of comparator 20, and FIG. 2C is a diagram illustrating the transfer function of comparator 20 shown in FIG. 2A.

Figure 3A:
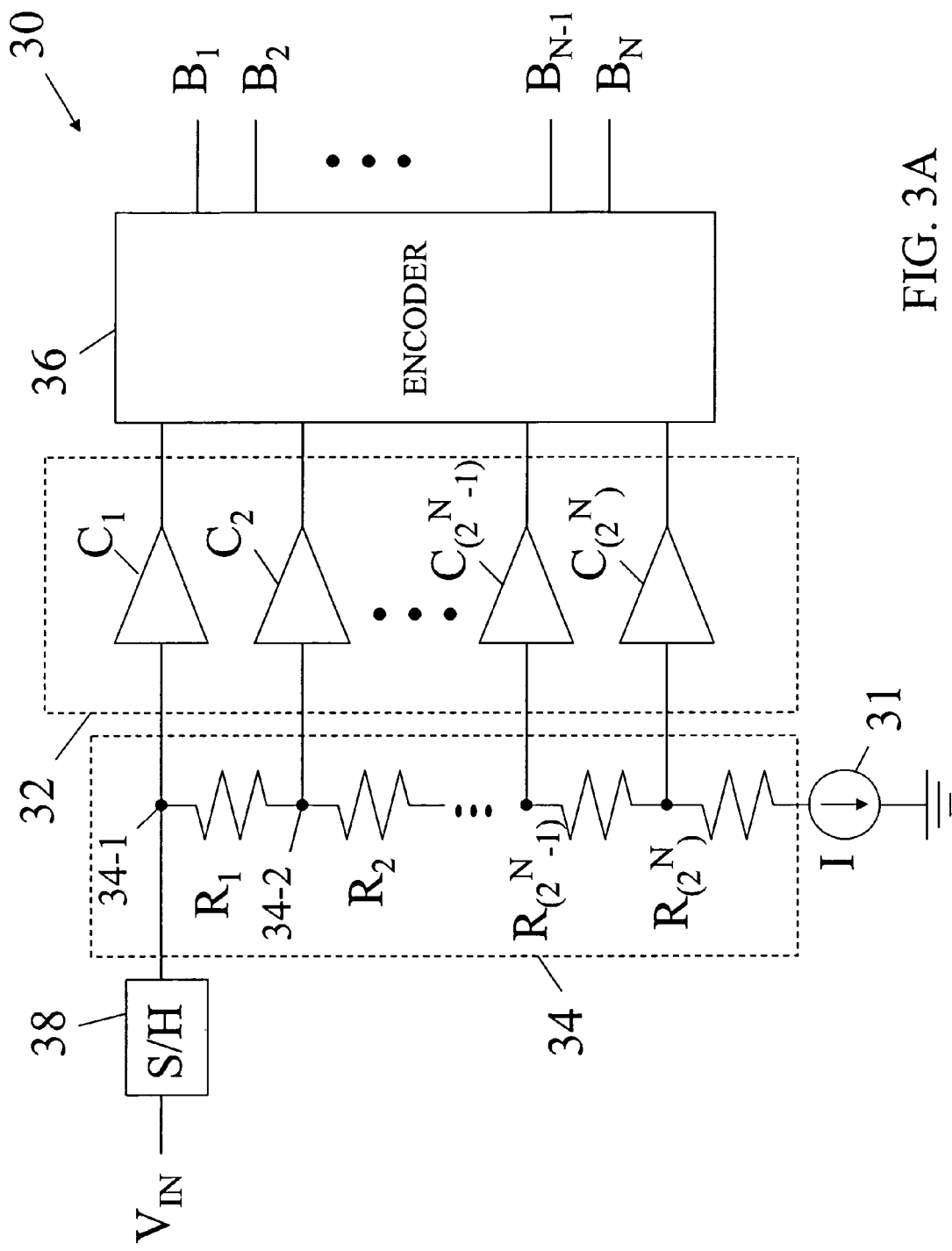
FIG. 3A is a circuit diagram of an ADC in accordance with one embodiment of the present invention.

FIG. 3A is a circuit diagram of an ADC 30 in accordance with one embodiment of the present invention. Referring to FIG. 3A, ADC 30 includes a comparator array 32, a resistor string 34, an encoder 36 and a current generator 31 providing a current flowing through resistor string 34. The number of comparators in comparator array 32 and the number of resistors in resistor string 34 required for an N-bit ADC 30 is $2^N$, N being an integer. Comparator array 32 includes a plurality of comparators $C_1$ to $C_{(2^N)}$, given an N-bit ADC 30. Each of the comparators $C_1$ to $C_{(2^N)}$ includes a first inverter and a second inverter connected in series, as shown in FIG. 2A. Resistor string 34 includes a plurality of resistors $R_1$ to $R_{(2^N)}$ connected in series. Each of the resistors $R_1$ to $R_{(2^N)}$ includes a first end and a second end, and corresponds to one of the comparators $C_1$ to $C_{(2^N)}$. Specifically, a first end 34-1 of a first resistor $R_1$ is electrically connected to a first comparator $C_1$, a first end 34-2 of a second resistor $R_2$ is electrically connected to a second comparator $C_2$, and so on. Current generator 31 provides a constant current I flowing through resistor string 34. Encoder 36 encodes the outputs from comparator array 32 to generate an N-bit encoded digital signal. The N-bit digital signal includes binary bit coefficients $B_1$ to $B_N$, each of which has a binary value of either 0 or 1, where $B_1$ represents the most significant bit and $B_N$ represents the least significant bit. ADC 30 may further include a sample-and-hold circuit 38 for receiving an input analog signal $V_{IN}$, and holding the input signal $V_{IN}$ to avoid changing the input signal during the conversion process.

Figure 3B:
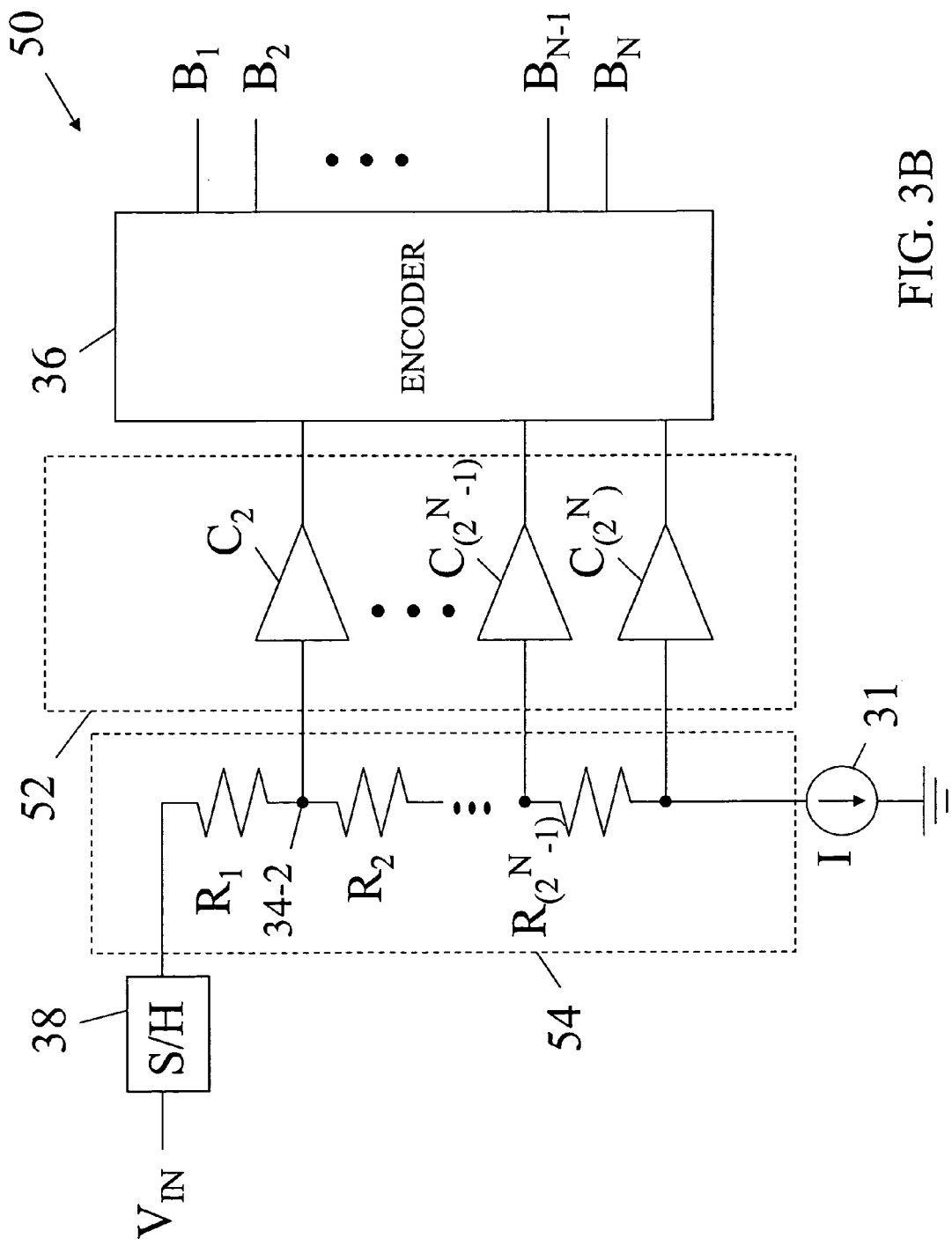
FIG. 3B is a circuit diagram of an ADC in accordance with another embodiment of the present invention.

Skilled persons in the art will realize that the number of comparators or resistor may not be limited to $2^N$, as long as encoder 36 is able to generate an N-bit encoded digital signal. FIG. 3B is a circuit diagram of an ADC 50 in accordance with another embodiment of the present invention. Referring to FIG. 3B, ADC 50 has a similar circuit structure to ADC 30 shown in FIG. 3A except a comparator array 52 and a resistor string 54. Specifically, ADC 30 includes a total number of $(2^N-1)$ comparators $C_2$ to $C_2{}^N$ in comparator array 52, and a total number of $(2^N-1)$ resistors $R_1$ to $R(2^N{}_{-1})$ in resistor string 54 corresponding to the comparators $C_2$ to $C_2{}^N$, respectively. In still another embodiment, an ADC according to the present invention includes a total number of $(2^N-1)$ comparators $C_1$ to $C(2^N{}_{-1})$ and a total number of $(2^N-1)$ resistors $R_1$ to $R(2^N{}_{-1})$ corresponding to the comparators $C_1$ to $C(2^N{}_{-1})$, respectively.

Figure 3C:
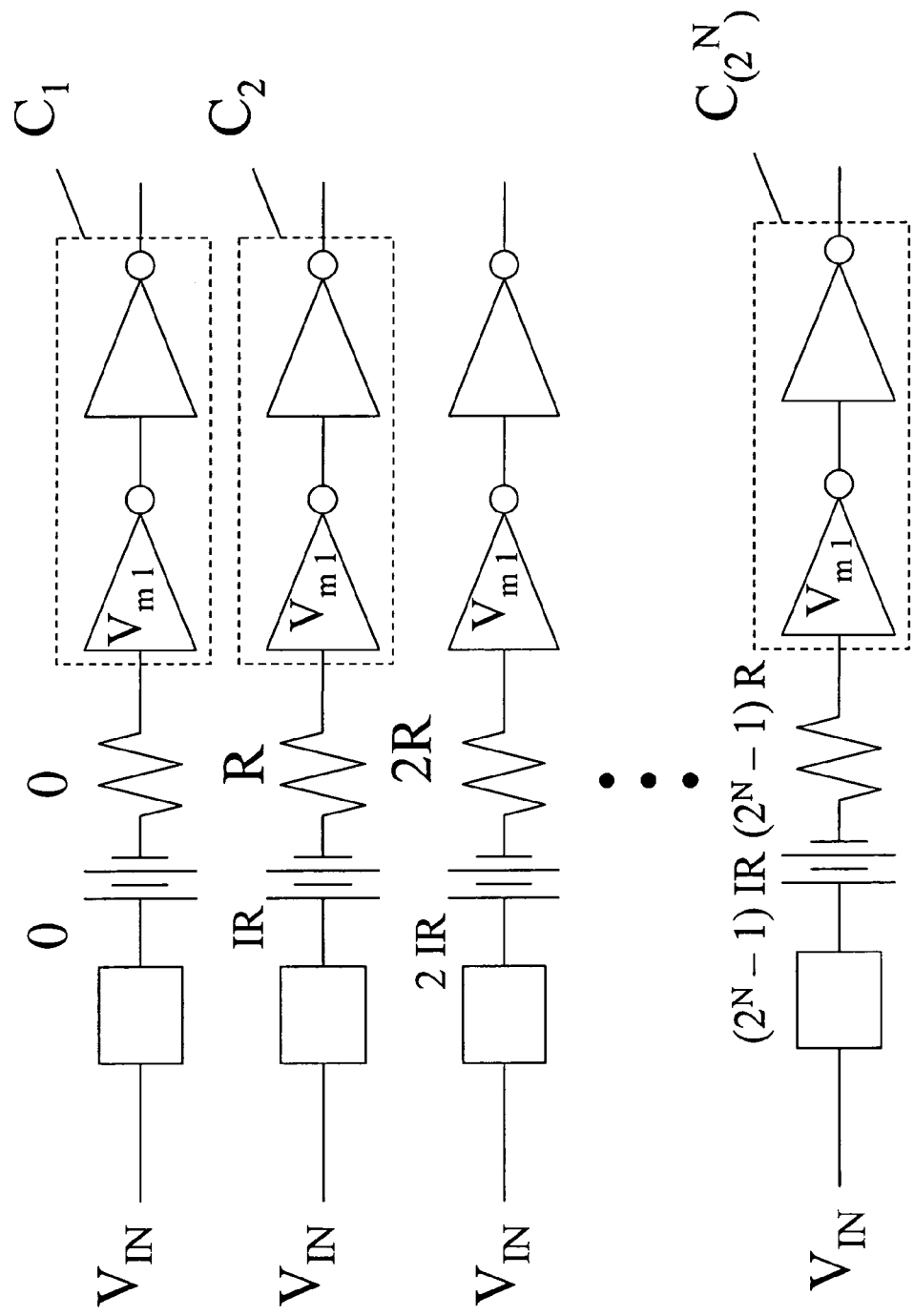
FIG. 3C is a diagram illustrating an equivalent circuit of the ADC shown in FIG. 3A.

FIG. 3C is a diagram illustrating an equivalent circuit of ADC 30 shown in FIG. 3A. Referring to FIG. 3C, given the resistance of each of the resistors $R_1$ to $R(2^N{}_{-1})$ being R, the voltage levels fed into comparators $C_1, C_2 \ldots$ and $C(2^N)$ are $V_{IN}, V_{IN}-IR \ldots$ and $V_{IN}-(2^N-1)$ IR, respectively. The first comparator $C_1$ then compares the corresponding input voltage level $V_{IN}$ with the switching threshold voltage $V_{m1}$ and then $V_{m2}$ to determine an output voltage level. Simultaneously, the second comparator $C_2$ compares the corresponding input voltage level $V_{IN}-IR$ with the switching threshold voltage $V_{m1}$ and then $V_{m2}$. For a comparator disposed downstream with respect to the comparator $C_1$ in the direction of resistor string 34 from resistors $R_1$ to $R(2^N)$ and separated from the comparator $C_1$ by a number of M comparators, M being an integer equal to or greater than zero, the corresponding voltage level fed to the comparator is $V_{IN}-(M+1)$ IR. For example, for the comparator $C_2$ disposed immediately adjacent to the comparator $C_1$ and separated from one another by no comparator, i.e., M equals zero, the corresponding voltage level fed to the comparator $C_2$ is $V_{IN}-IR$. Likewise, for the comparator $C(2^N)$ separated from the comparator $C_1$ by a number of $(2^N-2)$ comparators, the corresponding voltage level fed to the comparator $C_2$ is $V_{IN}-(2^N-1)$ IR.

Referring again to FIG. 3B, for a comparator disposed downstream with respect to a first comparator in the direction of resistor string 54, i.e., the comparator $C_2$, and separated from the comparator $C_2$ by a number of M comparators, the voltage level fed to the comparator is $V_{IN}-(M+2)$ IR.

Figure 3D:
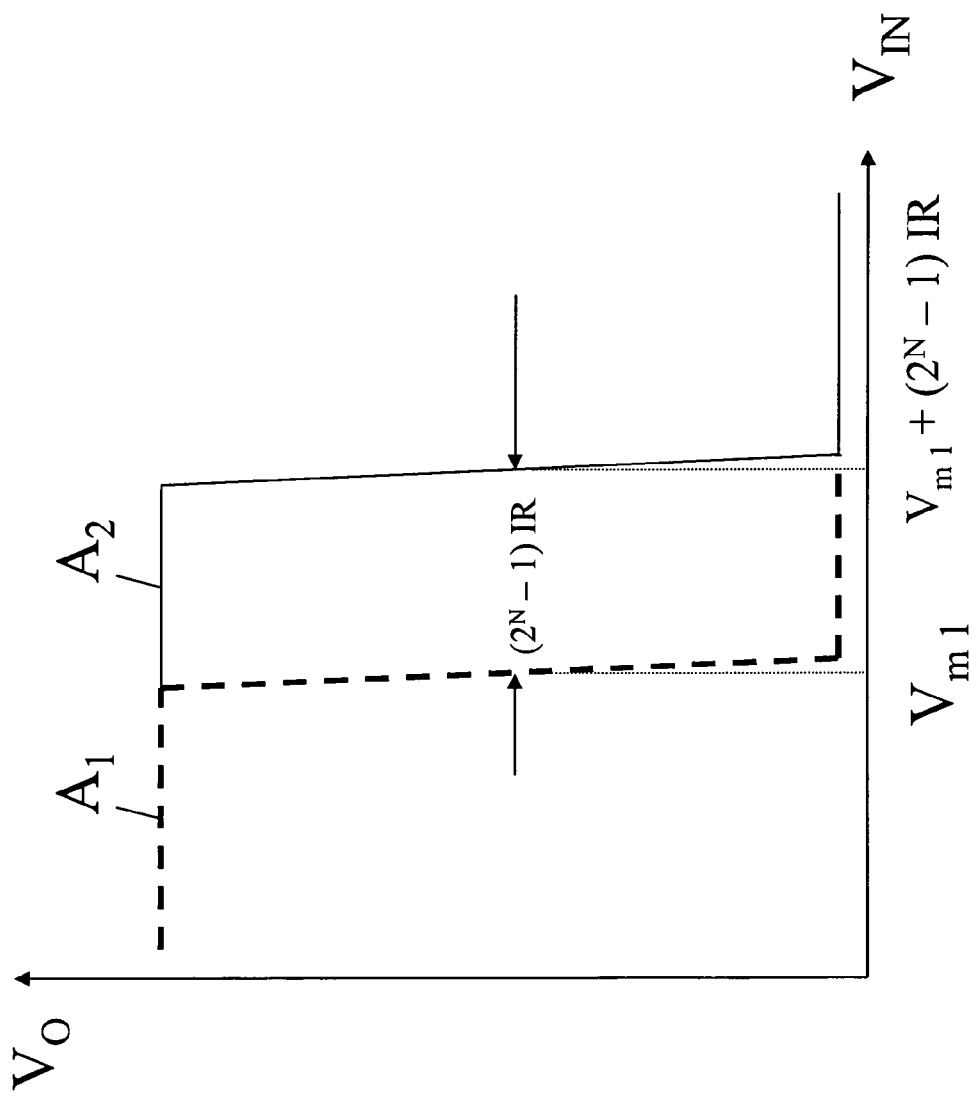
FIG. 3D is a diagram illustrating a dynamic transfer function of an inverter of the ADC shown in FIG. 3A.

FIG. 3D is a diagram illustrating a dynamic transfer function of an inverter of ADC 30 shown in FIG. 3A. Referring to FIG. 3D, also referring to FIG. 3A, due to the function of current generator 31 and resistor string 34, the first comparator $C_1$ compares the input voltage level $V_{IN}$ and the switching threshold voltage $V_{m1}$ of the first inverter of comparator $C_1$ to determine a voltage level of an output voltage $V_O$. The comparison result for the first inverter of comparator $C_1$ is illustrated in a curve $A_1$. Likewise, the last comparator $C(2^N)$ compares the input voltage level $(V_{IN}-(2^N-1)$ IR) and $V_{m1}$ to determine a voltage level of the output voltage $V_O$. The comparison result for the first inverter of comparator $C(2^N)$ is illustrated in a curve $A_2$. For a comparator disposed downstream with respect to the comparator $C_1$ and separated from the comparator $C_1$ by a number of M comparators, an input voltage level $(V_{IN}-(M+1)$ IR) is compared with $V_{m1}$. The comparison result of the first inverter of this comparator results in a curve (not shown) dynamically changeable between the curves $A_1$ and $A_2$, depending on the value of M.

Figure 3E:
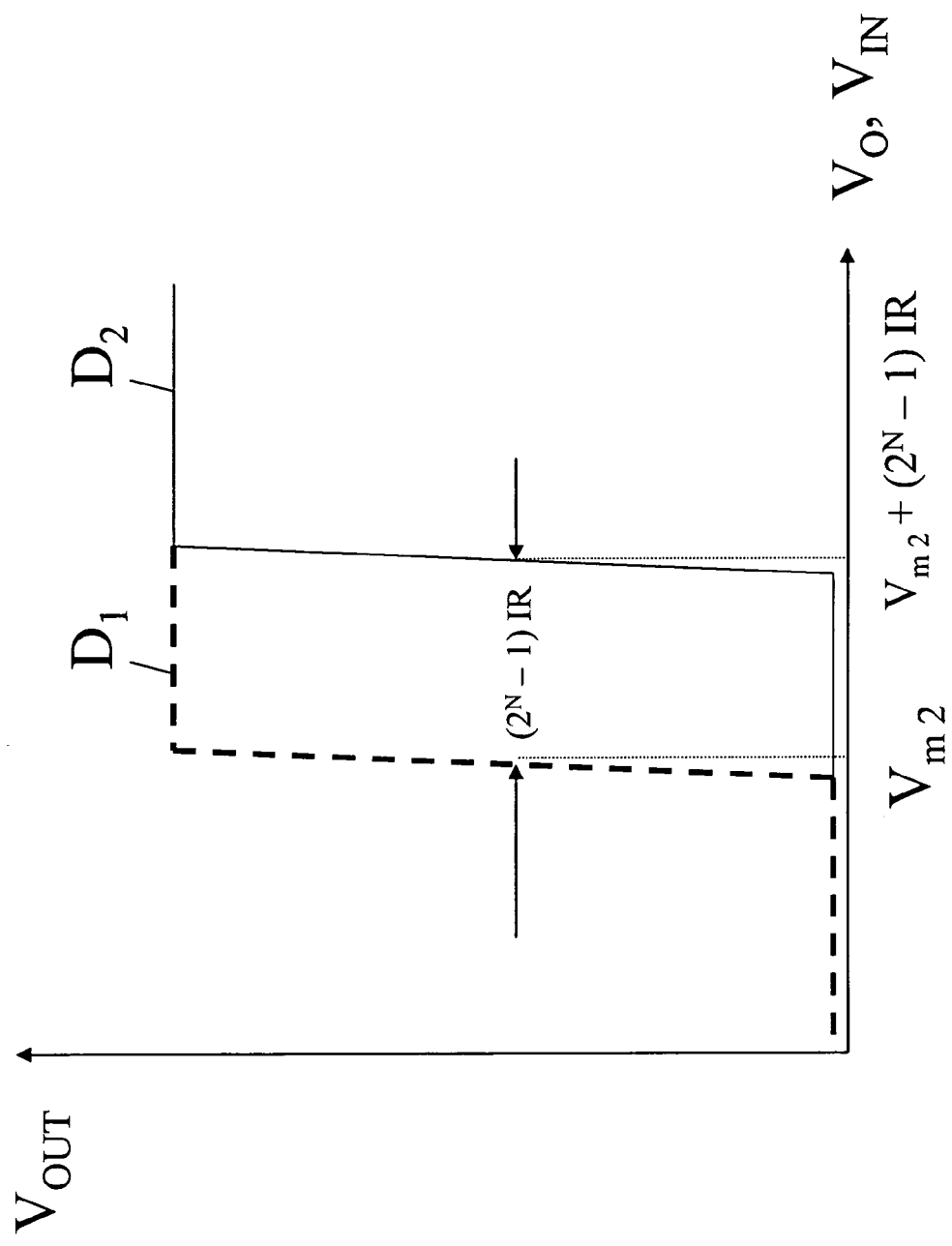
FIG. 3E is a diagram illustrating a dynamic transfer function of a comparator of the ADC shown in FIG. 3A.

FIG. 3E is a diagram illustrating a dynamic transfer function of a comparator of ADC 30 shown in FIG. 3A. Referring to FIG. 3E, the first comparator $C_1$ compares the voltage level $V_O$, which is a function of the input voltage level $V_{IN}$, and the switching threshold voltage $V_{m2}$ of the second inverter of comparator $C_1$, to determine a voltage level of an output voltage $V_{OUT}$. The comparison result for comparator $C_1$ is illustrated in a curve $D_1$. Likewise, the last comparator $C(2^N)$ compares the voltage level $V_O$, which is a function of the input voltage level $(V_{IN}-(2^N-1)$ IR), and $V_{m2}$ to determine a voltage level of the output voltage $V_{OUT}$. The comparison result for comparator $C(2^N)$ is illustrated in a curve $D_2$. For a comparator disposed downstream with respect to the comparator $C_1$ and separated from the comparator $C_1$ by a number of M comparators, the voltage level $V_O$, which is a function of the input voltage level $(V_{IN}-(M+1)$ IR), is compared with $V_{m2}$. The comparison result for the comparator results in a curve (not shown) dynamically changeable between the curves $D_1$ and $D_2$, depending on the value of M.

Figure 4A:
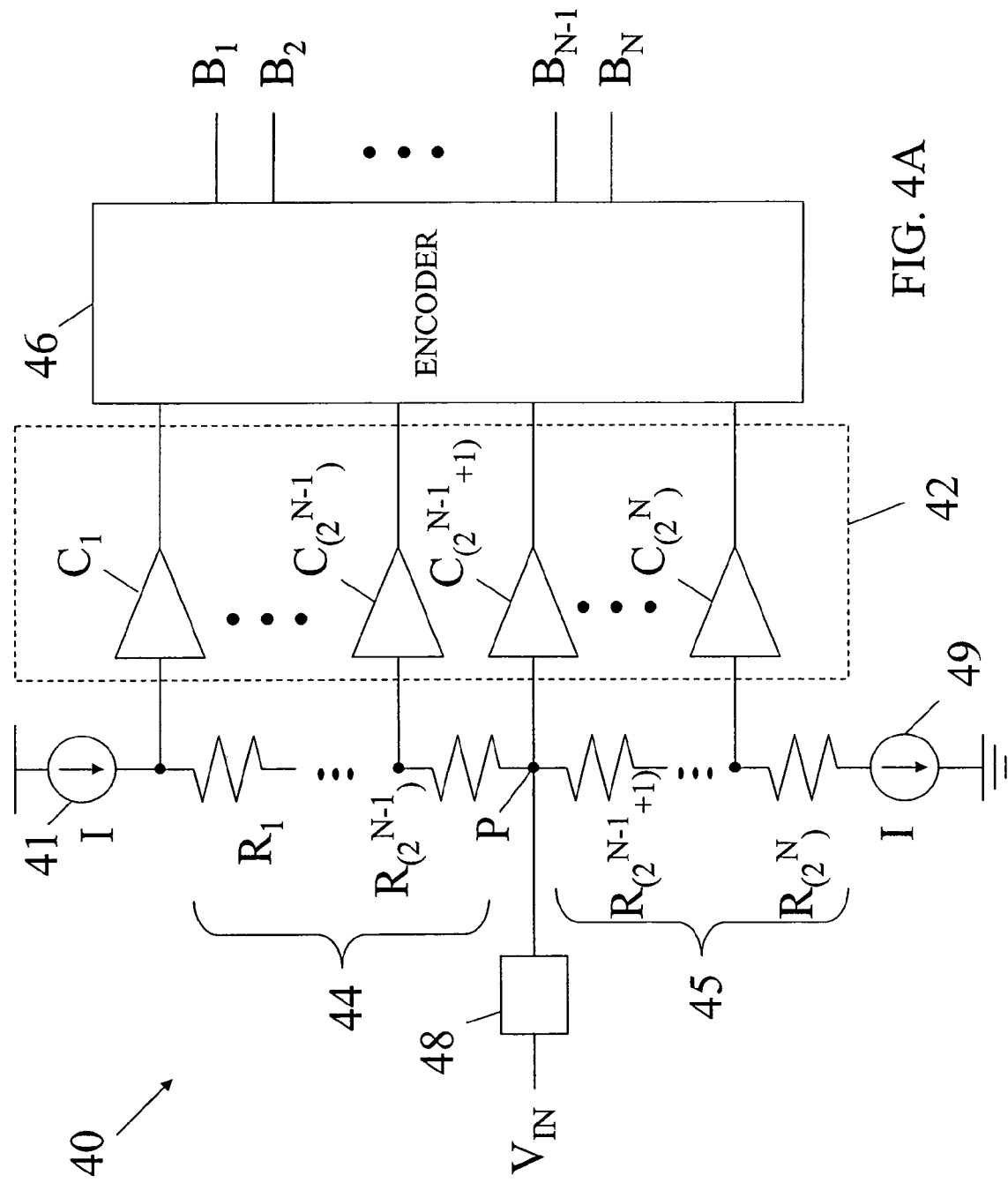
FIG. 4A is a circuit diagram of an ADC in accordance with another embodiment of the present invention.

FIG. 4A is a circuit diagram of an ADC 40 in accordance with another embodiment of the present invention. Referring to FIG. 4A, ADC 40 includes a comparator array 42, a resistor string further including a first sub-string 44 and a second sub-string 45, an encoder 46, a first current generator 41 providing a first current flowing through first sub-string 44, and a second current generator 49 providing a second current flowing through second sub-string 45. The number of comparators in comparator array 42 and the number of resistors in the resistor string required for an N-bit ADC 40 is $2^N$, N being an integer. Comparator array 42 includes a plurality of comparators $C_1$ to $C(2^N)$, given an N-bit ADC 40. Each of the comparators $C_1$ to $C(2^N)$ includes a first inverter and a second inverter connected in series, as shown in FIG. 2A. A receiving comparator $C(2^{N-1})$, which receives an input analog signal $V_{IN}$ through a sample-and-hold circuit 48, divides the resistor string into first sub-string 44 and second sub-string 45. First sub-string 44 is disposed upstream with respect to a point P where the input signal $V_{IN}$ is fed into receiving comparator $C(2^{N-1}{}_{+1})$. Second sub-string 45 is disposed downstream with respect to the point P. First sub-string 44 includes a plurality of resistors $R_1$ to $R(2^{N-1})$ connected in series. Second sub-string 45 includes a plurality of resistors $R(2^{N-1}{}_{+1})$ to $R(2^N)$ connected in series, and further connected in series with the plurality of resistors of first sub-string 44. Each of the resistors $R_1$ to $R(2^N)$ corresponds to one of the comparators $C_1$ to $C(2^N)$. First current generator 41 provides a first constant current having an magnitude of I flowing through first sub-string 44. Second current generator 49 provides a second constant current having the magnitude of I flowing through second sub-string 45.

Figure 4B:
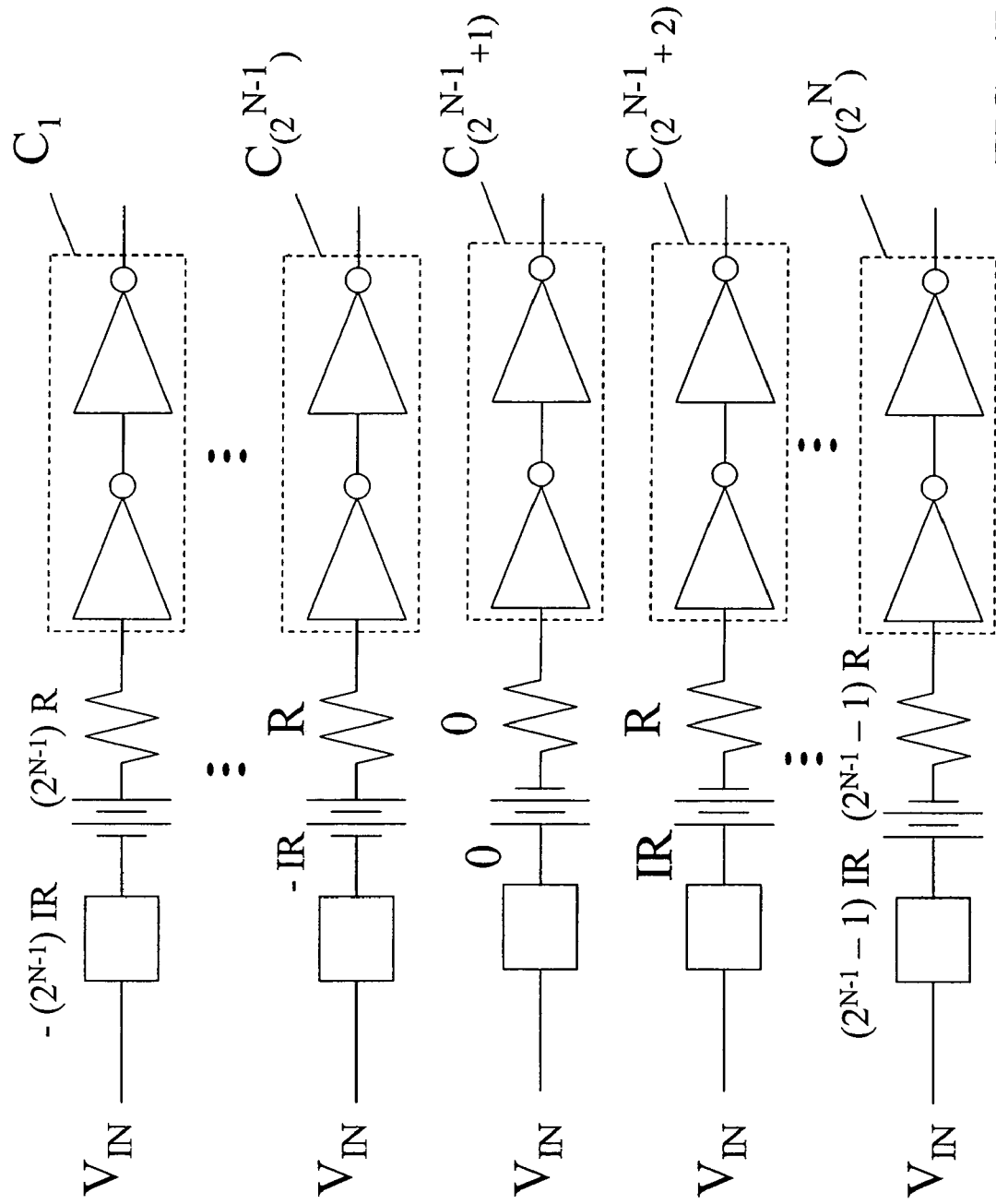
FIG. 4B is a diagram illustrating an equivalent circuit of the ADC shown in FIG. 4A.

FIG. 4B is a diagram illustrating an equivalent circuit of ADC 40 shown in FIG. 4A. Referring to FIG. 4B, given the resistance of each of the resistors $R_1$ to $R(2^N)$ being R, the voltage levels fed to the receiving comparator $C(2^{N-1}{}_{+1})$, and comparators $C(2^{N-1})$ and $C(2^{N-1}+2)$ are $V_{IN}$, $(V_{IN}+IR)$ and $(V_{IN}-IR)$, respectively. Likewise, the voltage levels fed to comparators $C_1$ and $C(2^N)$ are $(V_{IN}+C(2^{N-1})$ IR) and $(V_{IN}-C(2^{N-1}-1)$ IR), respectively. That is, for a comparator disposed upstream with respect to the receiving comparator $C(2^{N-1}{}_{+1})$ and separated from the receiving comparator $C(2^{N-1}{}_{+1})$ by a number of T comparators, the voltage level fed thereto is $(V_{IN}+T \times IR)$, T being an integer equal to or greater than zero. On the other hand, for a comparator disposed downstream with respect to the receiving comparator $C(2^{N-1}_{+1})$ and separated from the receiving comparator $C(2^{N-1}_{+1})$ by a number of T comparators, the voltage level fed thereto is $(V_{IN}-T \times IR)$.

Figure 4C:
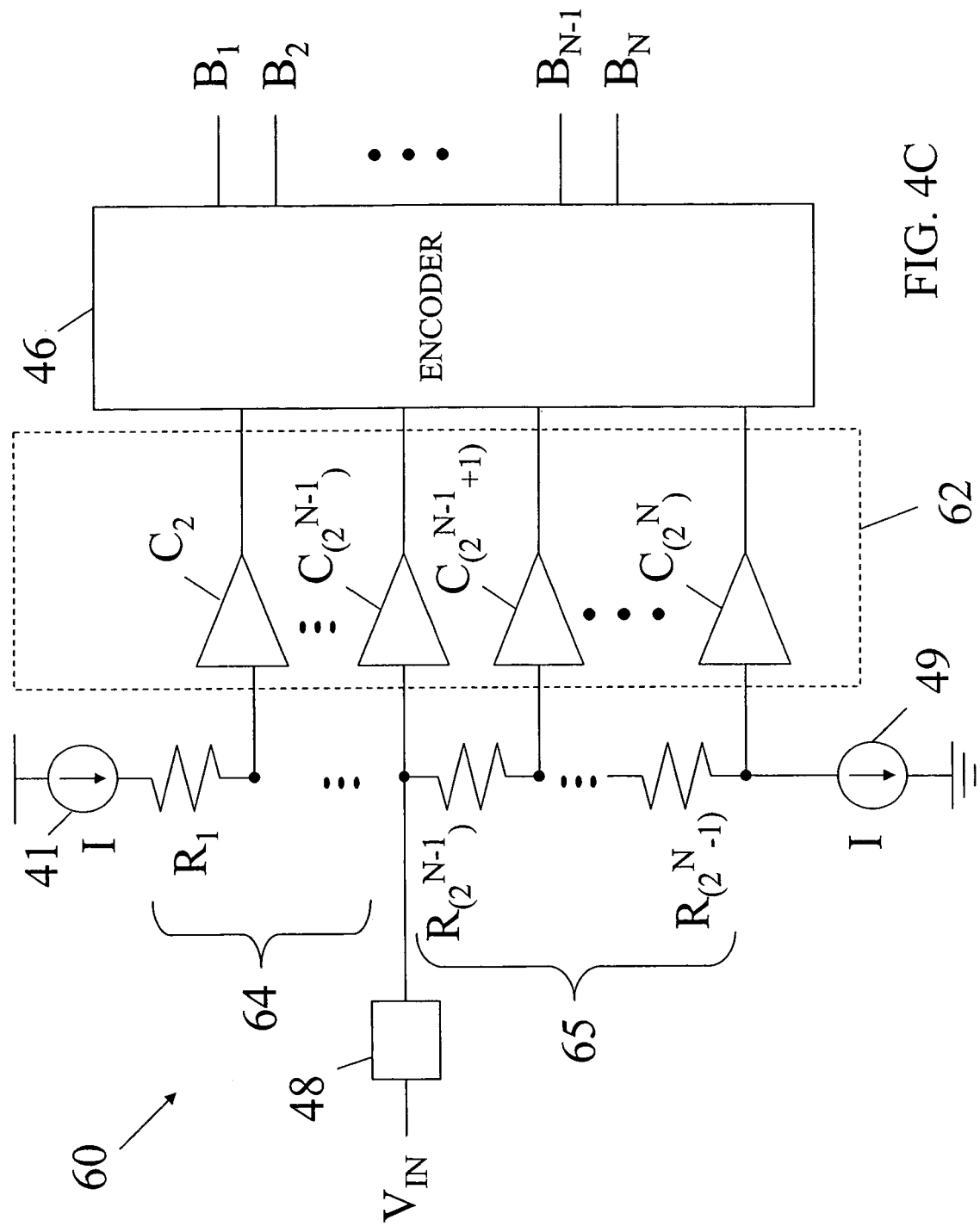
FIG. 4C is a circuit diagram of an ADC in accordance with still another embodiment of the present invention.

FIG. 4C is a circuit diagram of an ADC 60 in accordance with still another embodiment of the present invention. Referring to FIG. 4C, ADC 60 has a similar circuit structure to ADC 40 shown in FIG. 4A except a comparator array 62, first sub-string 64 and second sub-string 65. Specifically, ADC 60 includes a total number of $(2^N-1)$ comparators $C_2$ to $C_2^N$ in comparator array 62, and a total number of $(2^N-1)$ resistors $R_1$ to $R(2^N_{-1})$ in first sub-string 64 and second sub-string 65 corresponding to the comparators $C_2$ to $C_2^N$, respectively. The comparator $C(2^{N-1})$ is chosen to receive the input signal $V_{IN}$ through sample-and-hold circuit 48. As a result, the number of upstream resistors is equal to that of downstream resistors. For a comparator disposed upstream with respect to the receiving comparator $C(2^{N-1})$ and separated from the receiving comparator $C(2^{N-1})$ by a number of T comparators, the voltage level fed thereto is $(V_{IN}+T \times IR)$. Furthermore, for a comparator disposed downstream with respect to the receiving comparator $C(2^{N-1})$ and separated from the receiving comparator $C(2^{N-1})$ by a number of T comparators, the voltage level fed thereto is $(V_{IN}-T \times IR)$.

It will be appreciated by those skilled in the art that changes could be made to the preferred embodiments described above without departing from the broad inventive concept thereof. It is understood, therefore, that this invention is not limited to the particular embodiments disclosed, but is intended to cover modifications within the spirit and scope of the present application as defined by the appended claims.

We claim:

1. An analog-to-digital converter device for converting an analog signal into a digital signal, comprising:
   a comparator array including a plurality of comparators, each of the comparators including a first inverter and a second inverter connected in series with the first inverter;
   a resistor string including a plurality of resistors connected in series, each of the resistors corresponding to one of the plurality of comparators; and
   a current generator for providing a constant and equal current flowing through each resistor of the resistor string.

2. The device of claim 1, wherein the first inverters of the plurality of comparators have the same switching threshold voltage.

3. The device of claim 1, wherein the second inverters of the plurality of comparators have the same switching threshold voltage.

4. The device of claim 1, wherein each of the first inverters has the same a same switching threshold voltage as each of the second inverters of the plurality of comparators.

5. The device of claim 1, wherein one of the plurality of comparators is disposed most upstream with respect to other comparators in a direction of the constant current flow, and wherein for a comparator of the plurality of comparators separated from the most upstream comparator by a number of M comparators, M being an integer equal to or greater than zero, a voltage level fed to the comparator is $V_{IN}-(M+1)IR$, where $V_{IN}$ is a voltage level of the analog signal, I is the magnitude of the constant current, and R is the resistance of each of the resistors.

6. The device of claim 5, wherein the digital signal is an N-bit signal, N being an integer, and wherein the comparator compares a switching threshold voltage level $V_m$ with a voltage level of the analog signal ranging from $V_m$ to $V_m+(2^N-1)IR$.

7. The device of claim 1, wherein one of the plurality of comparators is disposed most upstream with respect to other comparators in a direction of the constant current flow, and wherein for a comparator of the plurality of comparators separated from the most upstream comparator by a number of M comparators, M being an integer equal to or greater than zero, a voltage level fed to the comparator is $V_{IN}-(M+2)IR$, where $V_{IN}$ is a voltage level of the analog signal, I is the magnitude of the constant current, and R is the resistance of each of the resistors.

8. The device of claim 7, wherein the digital signal is an N-bit signal, N being an integer, and wherein the comparator compares a switching threshold voltage level $V_m$ with a voltage level of the analog signal ranging from $V_m$ to $V_m+(2^N-1)IR$.

9. An analog-to-digital converter device for converting an analog signal into a digital signal, comprising:
   a comparator array including a plurality of comparators, each of the comparators including a first inverter and a second inverter connected in series with the first inverter;
   a resistor string including a plurality of resistors, each of the resistors corresponding to one of the plurality of comparators;
   a receiving comparator selected from one of the plurality of comparators for receiving the analog signal at a node of the resistor string without passing through any resistors of the resistor string;
   a first sub-string of the resistor string being separated from a second sub-string of the resistor string at the node;
   a first current generator for providing a first constant current flowing through the first sub-string; and
   a second current generator for providing a second constant current flowing through the second sub-string, the second constant current having the same value as the first constant current.

10. The device of claim 9, wherein the first inverters of the plurality of comparators have the same switching threshold voltage.

11. The device of claim 9, wherein the second inverters of the plurality of comparators have the same switching threshold voltage.

12. The device of claim 9, wherein each of the first inverters has the same switching threshold voltage as each of the second inverters of the plurality of comparators.

13. The device of claim 9, wherein the number of resistors of the first sub-string is equal to the number of the resistors of the second sub-string.

14. The device of claim 9, wherein for a comparator disposed upstream with respect to the receiving comparator in a direction of the first or second constant current flow and separated from the receiving comparator by a number of T comparators, a voltage level fed to the comparator is $V_{IN}+T \times IR$, where $V_{IN}$ is a voltage level of the analog signal, T is an integer equal to or greater than zero, I is the value of the first or second constant current, and R is the resistance of each of the resistors of the resistor string.

15. The device of claim 9, wherein for a comparator disposed downstream with respect to the receiving comparator in a direction of the first or second constant current flow and separated from the receiving comparator by a number of T comparators, a voltage level fed to the comparator is $V_{IN}-T \times IR$, where $V_{IN}$ is a voltage level of the analog signal, T is an integer equal to or greater than zero, I is the value of the first or second constant current, and R is the resistance of each of the resistors of the resistor string.

16. A signal processing system including an analog-to-digital converter for converting an analog signal into a digital signal, comprising:
an input analog signal;
a plurality of resistors connected in series for receiving the analog signal, each of the plurality of resistors including a tap end;
a plurality of comparators, each of the comparators including a first inverter connected to one of the plurality of resistors at the tap end of the one resistor, and a second inverter connected in series with the first inverter; and
a current generator for providing a constant and equal current flowing through each of the plurality of resistors.

17. The system of claim 16, wherein each of the first inverters and each of the second inverters have substantially the same switching threshold voltage.

18. The system of claim 16, wherein one of the plurality of comparators is disposed most upstream with respect to other comparators in a direction of the constant current flow, and wherein for a comparator of the plurality of comparators separated from the most upstream comparator by a number of M comparators, M being an integer equal to or greater than zero, a voltage level fed to the comparator is $V_{IN}-(M+1)$ IR, where $V_{IN}$ is a voltage level of the analog signal, I is the magnitude of the constant current, and R is the resistance of each of the resistors.

19. The system of claim 16, wherein the digital signal is an N-bit signal, N being an integer, and wherein the comparator compares a switching threshold voltage level $V_m$ with a voltage level of the analog signal ranging from $V_m$ to $V_m+(2^N-1)$ IR.

20. The system of claim 16, wherein one of the plurality of comparators is disposed most upstream with respect to other comparators in a direction of the constant current flow, and wherein for a comparator of the plurality of comparators separated from the most upstream comparator by a number of M comparators, M being an integer equal to or greater than zero, a voltage level fed to the comparator is $V_{IN}-(M+2)$ IR, where $V_{IN}$ is a voltage level of the analog signal, I is the magnitude of the constant current, and R is the resistance of each of the resistors.

21. A method for converting an analog signal into a digital signal, comprising:
providing a comparator array including a plurality of comparators, each of the comparators including a first inverter and a second inverter connected in series with the first inverter;
serially connecting a plurality of resistors in a resistor string, the resistor string including a plurality of nodes;
electrically connecting the plurality of comparators to the resistor string at the plurality of nodes such that each of the plurality of resistors corresponds to one of the plurality of comparators; and
flowing a constant and equal current through each resistor of the resistor string.

22. The method of claim 21, further comprising providing the plurality of comparators with the same first inverters.

23. The method of claim 21, further comprising providing the plurality of comparators with the same second inverters.

24. The method of claim 21, further comprising providing the first inverters and second inverters of the plurality of comparators with the same switching threshold voltage.

25. The method of claim 21, further comprising:
determining that one of the plurality of comparators is disposed most upstream with respect to other comparators in a direction of the constant current flow; wherein for a comparator of the plurality of comparators separated from the most upstream comparator by a number of M comparators, M being an integer equal to or greater than zero, feeding a voltage level of $(V_{IN}-(M+2)$ IR) to the comparator, where $V_{IN}$ is a voltage level of the analog signal, I is the value of the constant current, and R is the resistance of each of the resistors.

26. A method for converting an analog signal into a digital signal, comprising:
providing a comparator array including a plurality of comparators, each of the comparators including a first inverter and a second inverter connected in series with the first inverter;
serially connecting a plurality of resistors in a resistor string, the resistor string including a plurality of nodes;
electrically connecting the plurality of comparators to the resistor string at the plurality of nodes such that each of the plurality of resistors corresponds to one of the plurality of comparators;
selecting a receiving comparator from one of the plurality of comparators for receiving the analog signal at a node of the resistor string without passing through any resistors of the resistor string;
separating a first sub-string of the resistor string from a second sub-string of the resistor string at the node;
flowing a first constant current through the first sub-string; and
flowing a second constant current through the second sub-string, the second constant current having the same value as the first constant current.

27. The method of claim 26, further comprising providing the plurality of comparators with the same first inverters.

28. The method of claim 26, further comprising providing the plurality of comparators with the same second inverters.

29. The method of claim 26, further comprising providing the first inverters and second inverters of the plurality of comparators with the same switching threshold voltage.

30. The method of claim 26, further comprising providing the same number of resistors to the first sub-string and the second sub-string.

31. The method of claim 26, wherein
for a comparator disposed upstream with respect to the receiving comparator in a direction of the first or second constant current flow and separated from the receiving comparator by a number of T comparators, feeding a voltage level of $(V_{IN}+T\times IR)$ to the comparator, where $V_{IN}$ is a voltage level of the analog signal, T is an integer equal to or greater than zero, I is the value of the first or second constant current, and R is the resistance of each of the resistors of the resistor string.

32. The method of claim 26, wherein
for a comparator disposed downstream with respect to the receiving comparator in a direction of the first or second constant current flow and separated from the receiving comparator by a number of T comparators, feeding a voltage level of $(V_{IN}-T\times IR)$ to the comparator, where $V_{IN}$ is a voltage level of the analog signal, T is an integer equal to or greater than zero, I is the value of the first or second constant current, and R is the resistance of each of the resistors of the resistor string.

* * * * *